United States Patent [19]

Bartley et al.

[11] 4,127,934
[45] Dec. 5, 1978

[54] METHOD OF MAKING TERMINAL CONSTRUCTION FOR ELECTRICAL CIRCUIT DEVICE

[75] Inventors: John E. Bartley, Greenfield; Orville R. Penrod; Lawrence D. Radosevich, both of Muskego, all of Wis.

[73] Assignee: Allen-Bradley Company, Milwaukee, Wis.

[21] Appl. No.: 813,069

[22] Filed: Jul. 5, 1977

Related U.S. Application Data

[62] Division of Ser. No. 609,780, Sep. 2, 1975, abandoned.

[51] Int. Cl.² .............................................. H05K 3/32
[52] U.S. Cl. .................................... 29/626; 29/621; 29/628; 29/739; 338/312; 338/331; 361/402; 361/405
[58] Field of Search ................ 29/626, 628, 739, 621; 361/402, 404, 405, 307; 338/312, 331

[56] References Cited

U.S. PATENT DOCUMENTS

| 2,901,721 | 8/1959 | Aronson et al. | 338/331 X |
| 3,277,232 | 10/1966 | Ragan | 338/312 X |
| 3,873,890 | 3/1975 | Beckman et al. | 29/626 X |

FOREIGN PATENT DOCUMENTS 909817  11/1962  United Kingdom ..................... 361/307

Primary Examiner—Carl E. Hall
Attorney, Agent, or Firm—Arnold J. Ericsen

[57] ABSTRACT

An electrical circuit device having a substrate including circuit components on at least one side thereof and a plurality of through openings in the substrate. Terminal leads are positioned in the openings each with a deformation intermediate the ends of the leads and spaced internally of the opening from a soldered area at the juncture of the exposed portion of the leads and the termination edge of the substrate. Two methods of assembly of leads to the substrate are also disclosed.

6 Claims, 7 Drawing Figures

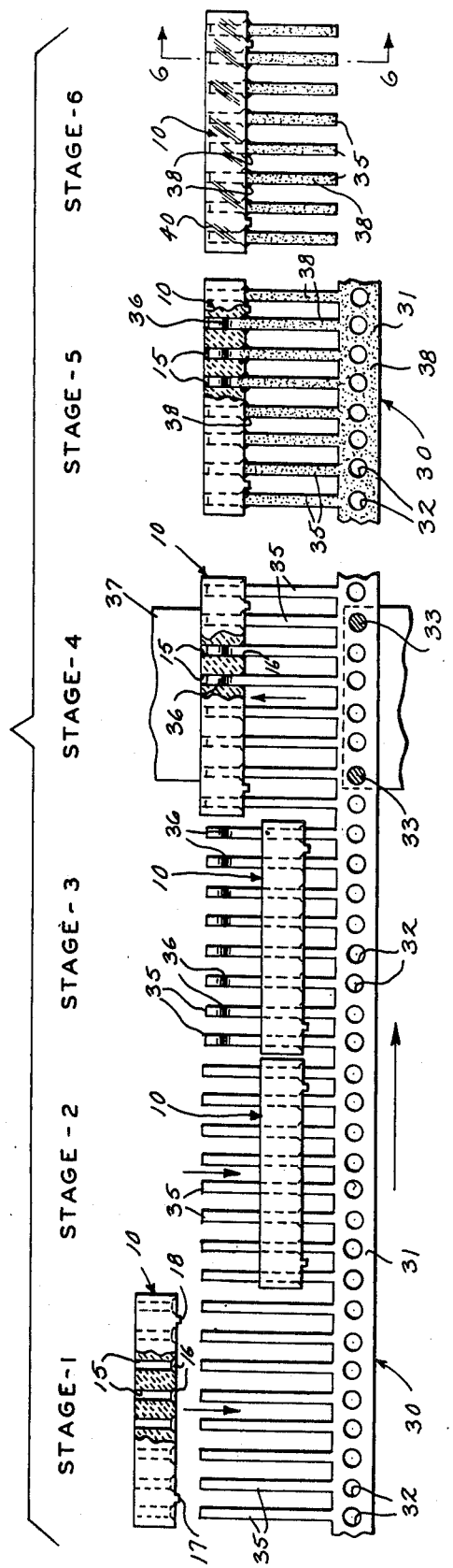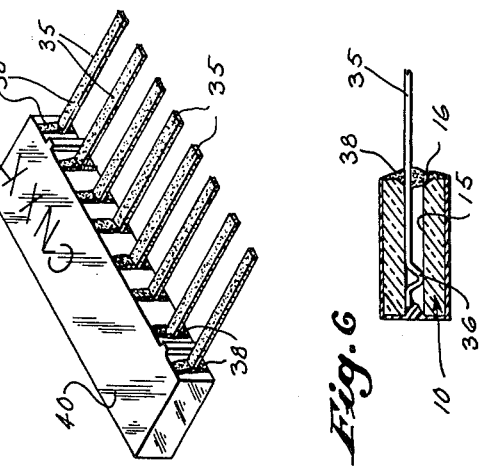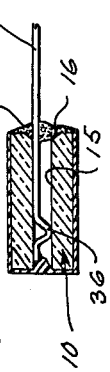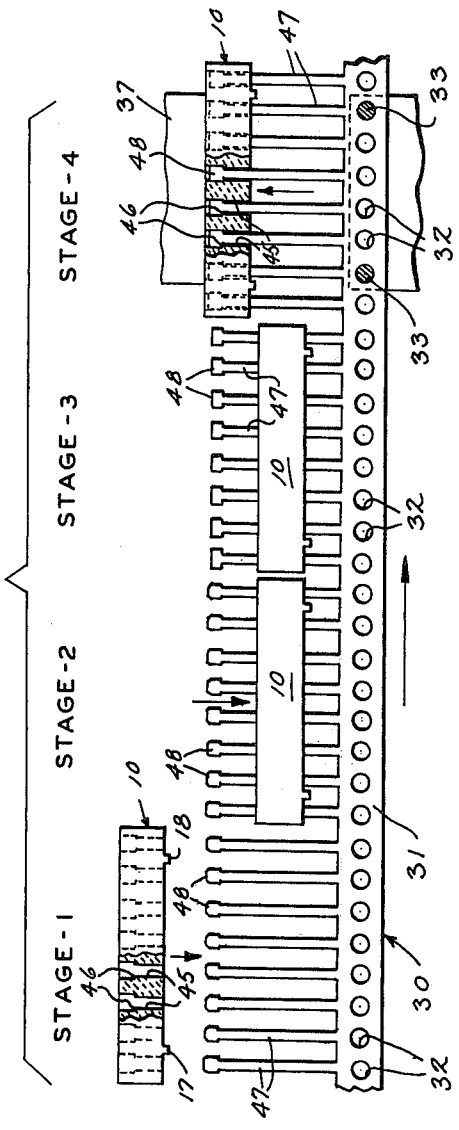

METHOD OF MAKING TERMINAL CONSTRUCTION FOR ELECTRICAL CIRCUIT DEVICE

This is a division, of application Ser. No. 609,780 filed Sept. 2, 1975, now abandoned.

BACKGROUND OF THE INVENTION

The invention relates to electrical circuit devices, and particularly to a method for anchoring and connecting lead wires to such devices.

In recent years there has been an increase in the usage of circuit devices comprising substrates of ceramic material such as alumina, steatite or other materials, wherein at least one surface of the substrate includes a deposited thick or thin film electrical circuit. The devices are generally modular and may include, in addition to resistive and capacitive elements, the addition of discrete components to provide hybrid circuits. It will be obvious that means for terminating the electrical circuitry is of equal importance to the circuitry itself in order to provide an acceptable unit. Circuits fundamentally depend upon the integrity of electrical continuity through the termination and lead wires required for connection to printed circuit boards or other circuit components. Various developments have brought forth techniques for terminating, each of which has been designed to provide the necessary electrical continuity with the circuit and strength to achieve proper pull force at the connection between the lead wire and the termination of the circuitry. In addition, the connection must be solid and stable so as to minimize electrical "noise" problems.

Terminating techniques and provisions of terminal leads have been illustrated in various patents most of which have been reviewed in U.S. Pat. No. 3,873,890 issued to Beckman et al and assigned to the same assignee as the present invention.

The device and method disclosed herein, although having application elsewhere, are principally related to so-called SIP (single in-line packaging) devices which are generally arranged to be supported in a position substantially normal to the plane of a printed circuit board or other mounting surface. Such devices may contain as many as seven or eight spaced apart lead wires closely positioned relative to one another.

The above-mentioned U.S. Pat. No. 3,873,890 teaches the insertion and retention of lead wires into a side of a ceramic substrate having an elongated groove divided into juxtaposed alternately distended and constricted portions, the constricted portions being adapted to receive the end portion of relatively flat lead wires. The constricted portion is metallized prior to receiving the lead wires and the lead wires are then inserted and soldered in place. The construction taught by Brady in his U.S. Pat. No. 3,346,774 disclosed a device which utilizes a substrate having lead wires anchored in cavities are of a size insufficient to freely receive the lead wires. The lead wires of Brady are forced into the cavity of the substrate to fixedly secure the lead wire directly to the substrate. The lead wire is further soldered in place to previously deposited metallized areas which areas include the entrance to the said cavities.

The Ragan U.S. Pat. No. 3,277,232 teaches a means of terminating an electrical circuit device with openings formed to traverse a substrate from end to end, and which substrate is arranged to receive oppositely disposed lead wires. Each lead wire has an end upset or bent to provide an obstruction externally of the substrate, which bent or upset headed portion is secured to the substrate by means of solder adhering to a metallized area, which is also connected to an electrical circuit disposed on the substrate.

Except for the Beckman et al. patent, most previously developed devices were designed to receive individual leads, whereas Beckman et al. and the device of the present invention are arranged to take advantage of "lead frame" construction, wherein a plurality of integrally formed leads project laterally from a common carrier portion of the frame. This type of construction leads itself to use in automated assembly, insertion, soldering and trimming apparatus. Previous devices suggest individual lead insertion techniques. Further consideration of the present disclosure, however, will reveal that although the best mode is considered to be in the form of so-called lead frame assembly, the invention may also utilize techniques of individual insertion of lead wires.

SUMMARY OF THE INVENTION

The present invention contemplates a method and means for anchoring and connecting leads to an electrical circuit device, wherein the configuration of the circuit is deposited on at least one surface of an insulating substrate. The substrate may be made of ceramic material, such as alumina or steatite and is pressed or otherwise formed to include a plurality of spaced apart, through openings traversing the substrate from one side to side. It is usual to provide the substrate as a rectangular, box-like object defining four sidewalls, which sidewalls are intercepted by the plurality of through openings. However, the exact configuration should not be considered so limited, as it will be apparent that other shapes may embody the concept without departing from the basic invention as will hereinafter be described.

In each of the parallel, spaced apart openings there is seated a terminal lead which has an external portion adapted for connection to a printed circuit board, or other means for connecting the electrical circuit device with another circuit element.

In the preferred embodiment, the inner portion disposed internally of a respective opening defines a crimped or corrugated, or otherwise deformed portion which is of such dimension as to be in intimate and relatively stable contact with the internal wall surface for its opening. The respective openings are preferably disposed in a plane parallel with a surface supporting the electrical circuitry. A preprinted edge termination area is deposited to traverse the opening, and preferably slightly inwardly thereof, and overlapping the surface containing the electrical circuitry to make contact with thick or thin film laid down upon that surface. The unit is solder dipped, with the solder gripping the lead at the juncture of the inner and outer portions of the lead and adhering to the preprinted edge termination area. The preprinted area is preferably of a known silver base which readily joins with the solder and the substrate material. The electrical circuitry may be applied to one side or to both sides of the substrate as required.

One interesting aspect of the present invention relates to the fact that should an ultimate user so desire, the usual conformal insulating coating may be omitted from the edge opposite the edge from which the leads extend. Thus, the exposed edge may provide means, if so desired and the circumstances permit, for testing circuitry with probes adapted to enter the openings and contact ends of the leads exposed in the openings. Also, it is conceivable that "cross over" connections may be made between the leads by preprinting and soldering an edge termination extending between adjacent openings and the distal ends of the internal portions of the leads disposed in the openings. In the latter case it may be desired to cover the solder area with a conformal insulating coating to minimize the possibility of short circuiting the device with another device or another printed circuit board positioned adjacent to the device.

The invention is further exemplified in the preferred method of assembly wherein the leads are deformed externally and are withdrawn after deformation to be positioned within the openings in the substrate, as well as presenting variations of lead configurations. Obviously, after considering these variations, it will become apparent that additional modifications may be made without departing from the scope of the invention.

One of the preferred methods utilizes an indefinite length of lead frame having a carrier strip portion from which there extends a plurality of spaced apart elongated lead members. The lead frame is stamped from flat metal stock and preferably includes a plurality of spaced apart guide openings for registering and indexing the stock during the stage of insertion, deforming and inserting steps as will hereinafter be described. For the purpose of this summary, however, the substrate containing the circuit components and appropriate edge termination areas, is positioned on the lead frame with the elongated, flat lead member being disposed within the openings and extending outwardly through the other end of the respective openings. The extending lead portions, with the substrate inserted thereon, are next crimped, corrugated or otherwise deformed preferably at the distal end portion thereof. The substrate and the lead assembly are then moved relative to one another, with the substrate resting against a stationary stop to provide the desired positioning of the leads in the opening. At this stage, the leads and the substrate will be held together since the deformed portion will act to provide intimate contact with the inner surface of the respective openings. The next stage is the application of solder, wherein the entire unit may be dipped in solder to coat the leads, the exposed edge termination areas and also to provide a means of joining the leads to the substrate. The unit is then encapsulated with an insulating conformal coating, which may be of a material that also encloses the exposed end of each opening, if so desired. The final stage involves the cutting off the carrier strip. Depending upon the equipment and other factors, the soldering and coating stages may be in reverse order.

Another embodiment discloses a substrate having a plurality of spaced through openings through which lead portions of a lead frame extend and are then coined at their distal end portions to provide an abutment for intersection with the shoulder of the opening.

Among the several objects of the present invention, is the provision of an electrical circuit device having lead wire terminations with a portion extending into a respective transverse opening of a substrate and with the distal end being deformed after insertion to resist withdrawal of the lead wire prior to and after solder is applied to the juncture of the lead and substrate.

The foregoing and other objects and advantages will appear in the following drawings which form a part hereof and which show by way of illustration a preferred embodiment of the invention. Such embodiment does not necessarily represent the whole scope of the invention, and reference is made to the claims herein for interpreting the breadth of the invention.

BRIEF DESCRIPTION OF THE DRAWINGS

FIG. 4 is a top plan view of a lead frame assembly illustrating six stages in the process of manufacturing electrical circuit devices of the present invention;

FIG. 5 is a top plan view of a lead frame strip illustrating another embodiment of the substrate and leads typifying another embodiment of the present invention;

FIG. 6 is a cross-sectional view of the device on the present invention taken along the lines 6—6 in Stage 6 of FIG. 4; and FIG. 7 is a perspective view of the finished product with conformal coating applied and identification printed thereon.

DESCRIPTION OF THE PREFERRED EMBODIMENTS

Figure 1:
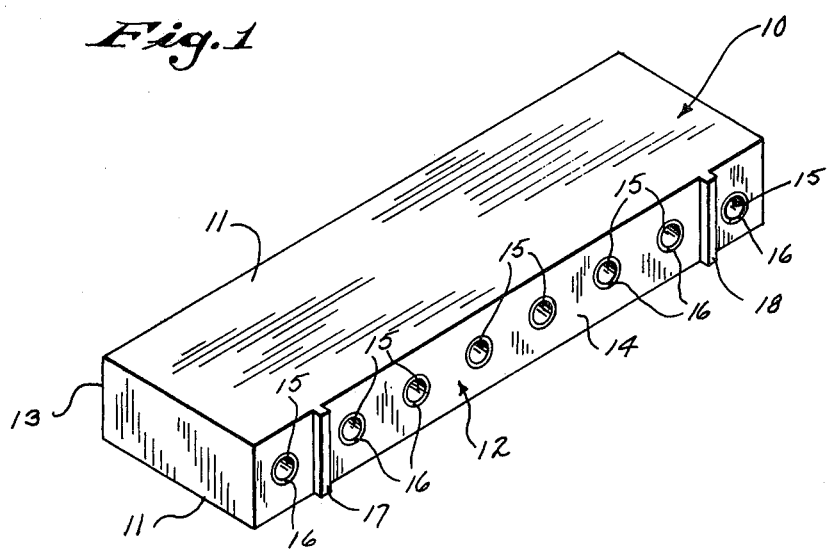
FIG. 1 is a perspective view of a substrate suitable for use in the practice of the present invention.

The substrate manufacture and use is best described with reference to FIGS. 1-3, inclusive. An insulating substrate 10 is pressed, or otherwise formed, from a ceramic material such as alumina or steatite to provide opposed upper and lower planar surfaces 11. Depending from, and angularly relative to, the planar surfaces 11 is a continuous side surface indicated generally by the reference character 12 defining opposed parallel surfaces 13 and 14.

Either one or both of the surfaces 11 may contain the electrical circuitry which may be in the form of a network of resistors, a combination of resistors and capacitors and semiconductor chips, or chips of capacitors or the like. The circuit configuration is made in accordance with known techniques and does not form the particular part of the present invention.

The opposed sidewall surfaces 13 and 14 include a plurality of spaced apart openings 15 traversing the substrate 11 from sidewall 13 to sidewall 14 (see also FIG. 6). As shown, surface 14 also defines a slight countersunk portion 16 which provides ready access of leads, as will hereinafter be described. For the purpose of spacing the sidewall 14 of the substrate 10 from a circuit board or other means of mounting, the substrate 10 is provided with a pair of forwardly projecting stand-offs 17 and 18.

Figure 2:
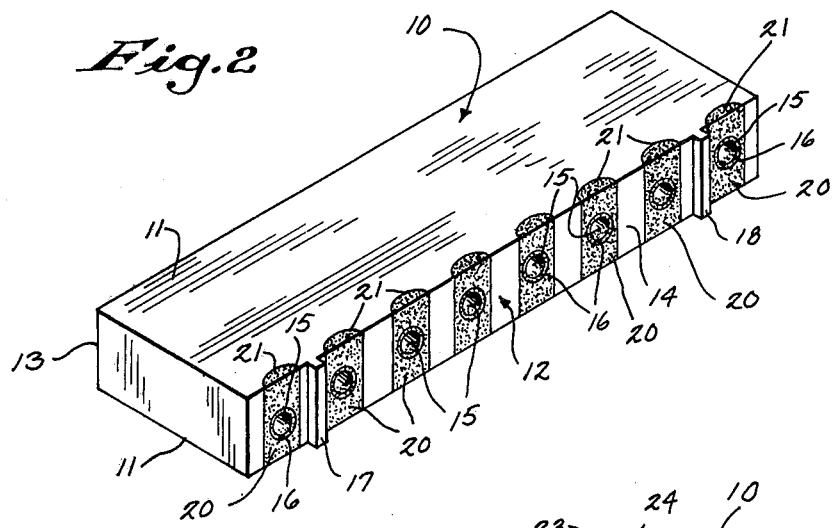
FIG. 2 is a perspective view of the substrate of FIG. 1 after printing of the edge termination configuration.

With reference to FIG. 2, the substrate 10 is provided with edge termination areas 20. The areas 20 are printed with a conducting material such as silver paste, extending across the face of the surface 14 and preferably a bit inwardly of the openings 15, and overlapping the surface 11 as shown at 21. This overlapping area 21 connects the electrical circuitry to the edge of the substrate 10, as will later be explained. The material of the termination areas 20 (in this case silver paste) is well known and is compatible with solder for connecting the leads as will hereinafter be described. After application, the silver paste edge termination 20 is fired on the substrate in the usual fashion.

Figure 3:
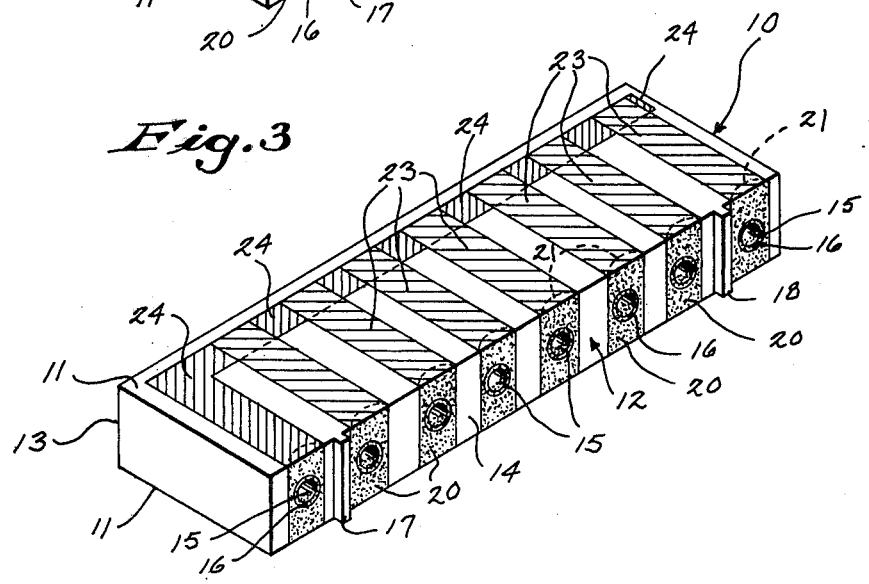
FIG. 3 is a perspective view, including the edge termination and a typical resistive network circuit deposition on the upper surface of the substrate of FIGS. 1 and 2.

A typical resistive network is shown in the view of FIG. 3, and may be of a thick or thin film material, such as the well known cermet resistor materials, one of which is described in the Brandt et al U.S. Pat. No. 3,639,274, assigned to the same assignee as the present invention. The particular composition does not form a part of the present invention.

The resistive areas are denoted by the reference character 23, and in the case of cermet material, are screen printed or otherwise deposited to extend over the overlapping portion 21 of the edge termination 20. Without going into the details of the circuitry, which is unimportant to the present invention, a conductive strip 24 of cermet material is laid down before the resistive layers 23 in known fashion. This material is also of a glassy matrix including a highly conductive metallic material intermixed herewith. The layers may be fired individually or co-fired as desired.

The present embodiment illustrates a single in-line package (SIP) which includes, as shown in FIG. 7, an eight leaded construction. FIG. 4 illustrates, in six stages, the preferred method of assembly of leads to the substrate, in accordance with the present invention. A continuous lead frame, indicated generally by the reference numeral 30, is stamped or otherwise formed from a conducting metallic material suitable for use in termination leads. The portion identified as a carrier strip 31 preferably includes longitudinally spaced apertures 32 which are used for guiding, registering, and conveying purposes. As shown in Stage 4 of FIG. 4, the apertures 32 may receive index and support the ends 33 for purposes to be later described. In general, suffice it to say that the apertures 31 may be received by conventional sprocket teeth for movement of the frame 30 in the direction of the arrow, and also for registration of the lead frame as necessary in the various stages. Integral with and projecting laterally from the carrier strip 31 is a plurality of spaced apart lead members 35 arranged to be received in the openings 15 of the substrate 10. It will be apparent that the countersunk portion 16 of the opening 15 will assist in the reception of the leads 35 as the lead frame 30 is being moved during the several procedural stages.

It is to be noted, that although the various stages are indicated as taking place immediately in sequence, with the substrates 10 adjacent to one another, an indefinite number of substrates may be used in each of the stages along the lead frame 30 in accordance with known assembly techniques.

With reference to FIG. 4, Stage 1, it will be observed that the relatively flat termination lead members 35 of the lead frame 30 are inserted into the respective openings 15 of the substrate 10. As indicated at Stage 2, the substrate 10 and the carrier strip 31 are drawn toward one another to expose the distal end portion of the lead member 35. This permits freedom of access to the exposed portions of the leads for purpose of seating the leads in a "bumping" or forming tool (not shown). The die members of the tool are designed to provide a deformation of the extremities as shown in Stage 3 of FIG. 4 and FIG. 6. Here, the deformation takes the form of undulations or corrugations 36 which serve to extend the thickness of the lead members 35 in "spring" fashion. As shown in Stage 4 of FIG. 4, the substrate and the carrier strip 31 are drawn away from one another in the direction of the arrow. A stationary stop member 37 is provided to position the substrate relative to the ends of the leads 35. Guideposts 33 retain the carrier strip 31 while the substrate 10 is being moved upwardly against the stop. It will be noted that the spacing from the wall 13 and the end of the lead portion 35 may be adjusted by the position of the stop 37. As shown in Stage 5 of FIG. 4, the leads 35 are retained in place within the openings 15 of the substrate 10 by intimate contact with the inner walls of the openings 15 because of the deformation 36 of the leads 35. The lead portions 35 are further securely retained in place by solder deposition, wherein the substrate 10 and the lead frame may be passed through a solder bath. The solder layer 38 will cover each of the externally extending portions of the leads 35 and the edge termination areas 20 which, as previously stated, preferably extend slightly inwardly of the openings 15. This arrangement provides a very secure and stable retention of the lead in the opening. That is, the lead extends substantially coextensive of the length of the opening to be frictionally gripped at its inwardly extending portion and additionally secured by solder retention of the edge termination areas of the substrate 10. The stability of this means of retention will become immediately apparent.

Stage 6 of FIG. 4 illustrates the substrate 10 with the carrier strip 31 removed. The electrical circuitry, has not been shown in any of the stages of FIG. 4, but is deposited on the substrate prior to State 1 as described in accordance with FIG. 3. The insulating conformal coating 40 is, applied to the substrate following Stage 5 as indicated in Stage 6. The coating may be applied with well known dipping, brushing, spraying or other techniques. The carrier strip 3 has also been cut and removed from the device as shown at Stage 6. The unit is then imprinted as shown in FIG. 7 with appropriate indicia 41.

Another embodiment of the present invention is disclosed in the assembly stages of FIG. 5. In this embodiment, there is contemplated the various steps of preparing a substrate as disclosed in FIGS. 1, 2, and 3, but with an alternative form of through opening 45. With reference to Stage 1 of FIG. 5, it will be observed that the openings 45 each include an inwardly extending abutment in the form of a counterbore defining a shoulder portion 46 for purposes hereinafter described. In this case, leads or the lead members 47 are preformed with a slightly enlarged distal end portion 48. The enlarged portion 48 is limited in dimension to allow free passage of the leads 47 in their respective openings 45 in the substrate 10 (see Stage 2, FIG. 5). The distal end portions or extremities 48 of the lead portions 47 are then deformed by coining as indicated at Stage 3, or otherwise formed to insure that the extremities 48 will not pass the shoulder portions 46 of the respective openings 45 as the substrate is moved toward the stop 37. It will be apparent that the embodiment of FIG. 5 provides additional means for preventing withdrawal of the leads 47 from the openings 45, should additional pull strength be required. Stages 5 and 6 of FIG. 5 have been omitted, because they are the same as stages used in the embodiment of FIG. 4.

It will be understood that the electrical circuit components such as the resistive areas 23 may be printed on either or both of the top or bottom surfaces 11 of the substrate 10, and that the lead portions 35 may be of the well known pin type (not shown). When the pin type lead portions are used, the insertion technique are those used with machines which handle wire leads. However, the pin type leads would be deformed in the same manner as disclosed in the present invention to be compatable with the various stages of FIGS. 4 and 5.

We claim:

1. A method of anchoring and connecting terminal leads to a substrate containing electrical circuit components on a surface thereof, comprising the steps of:

forming a substrate having a circuit supporting planar surface, oppositely disposed planar sidewall surfaces depending from and disposed angularly relative to said circuit supporting surface, and including a plurality of transversely disposed, spaced apart openings extending through said substrate and intersecting each of the sidewall surfaces at opposite ends of each of said openings;

depositing a conducting termination coating area disposed transversely of at least one of said sidewall surfaces across one end of each of said openings and overlapping a portion of said circuit supporting surface;

depositing a layer of electrical circuit components on said circuit supporting surface with connecting portions electrically connected to the said termination coating;

providing a plurality of terminal leads; inserting individual leads into their respective openings in said substrate with a portion of each lead extending outwardly from the opposite sidewall of the substrate;

deforming the extending portion of said leads; and moving said substrate and said leads in a direction away from one another to cause the deformed portion of each of said leads to re-enter the respective opening and to be positioned for intimate contact with the surface of said opening.

2. The method of claim 1, wherein the forming step provides a substrate with openings having substantially uniform cross-section throughout its length.

3. The method of claim 2, wherein the leads are formed from flat stock and are each deformed to provide at least one corrugation across the flat surface, the depth of said corrugation being of greater lateral dimension than the dimension of the surface of the respective opening in contact with the corrugation.

4. The method of claim 1, wherein the forming step provides a substrate with openings having a counterbore defining an inwardly extending abutment intermediate the ends of the opening, and the respective leads are deformed to engage the said abutment.

5. The method of claim 4, wherein the leads are deformed by a coining operation to provide lateral projecting portion of a dimension greater than the inwardly extending abutment of said opening.

6. The method of claim 1, wherein the terminal leads are provided as spaced apart, substantially parallel members integral with and laterally extending from an elongated carrier strip portion of a preformed lead frame assembly.

* * * * *